(12) United States Patent
Chinnakkonda Vidyapoornachary et al.

(10) Patent No.: US 9,864,537 B2
(45) Date of Patent: Jan. 9, 2018

(54) MEMORY SYSTEM POWER MANAGEMENT

(71) Applicant: International Business Machines Corporation, Armonk, NY (US)

(72) Inventors: Diyanesh B. Chinnakkonda Vidyapoornachary, Bangalore (IN); Marc A. Gollub, Pflugerville, TX (US); Tony E. Sawan, Round Rock, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/134,456

(22) Filed: Apr. 21, 2016

(65) Prior Publication Data

US 2017/0308313 A1    Oct. 26, 2017

(51) Int. Cl.
  *G11C 29/00* (2006.01)
  *G06F 3/06* (2006.01)
  *G06F 11/10* (2006.01)
  *G11C 29/52* (2006.01)

(52) U.S. Cl.
  CPC .......... *G06F 3/0625* (2013.01); *G06F 3/0619* (2013.01); *G06F 3/0631* (2013.01); *G06F 3/0652* (2013.01); *G06F 3/0679* (2013.01); *G06F 11/1068* (2013.01); *G11C 29/52* (2013.01)

(58) Field of Classification Search
  CPC .... G06F 3/0625; G06F 3/0619; G06F 3/0652; G06F 3/0679; G06F 3/0631; G06F 11/1068; G11C 29/52
  See application file for complete search history.

(56) References Cited

U.S. PATENT DOCUMENTS 6,530,035 B1 *  3/2003  Bridge ................ G06F 11/1076
                                                            714/6.12
7,079,341 B2    7/2006  Kistler et al.
8,122,268 B2    2/2012  Akelbein et al.
(Continued)

OTHER PUBLICATIONS

Disclosed Anonymously, "Method for Memory Power Management", IP.com No. 000228822, Jul. 9, 2013; 5 pages.
(Continued)

*Primary Examiner* — Sam Rizk
(74) *Attorney, Agent, or Firm* — Cantor Colburn LLP; Robert Williams

(57) ABSTRACT

An aspect includes a method for receiving a memory allocation request for a logical partition. Partition mirroring is enabled for the logical partition. Unscrubbed memory is allocated to both a first and a second copy of the logical partition, with the second copy of the logical partition mirroring the first copy of the logical partition. Scrubbing of the first and second copy of the logical partitions is initiated. Subsequent to initiating the scrubbing one of the first and second copy of the logical partition is selected and partition mirroring is disabled for the logical partition. The first copy of the logical partition is deallocated based on selecting the second copy of the logical partition. The second copy of the logical partition is deallocated based on selecting the first copy of the logical partition. The copy that is selected will continue to be scrubbed on a periodic based.

17 Claims, 5 Drawing Sheets

(56) References Cited

U.S. PATENT DOCUMENTS

| | | | | |
|---|---|---|---|---|
| 2006/0206662 A1* | 9/2006 | Ludwig | ................ | G06F 3/0607 |
| | | | | 711/114 |
| 2009/0282300 A1* | 11/2009 | Heyrman | ............ | G06F 11/2082 |
| | | | | 714/708 |
| 2011/0131399 A1* | 6/2011 | Sainath | ................ | G06F 11/106 |
| | | | | 713/2 |
| 2015/0278011 A1 | 10/2015 | Keppel et al. | | |

OTHER PUBLICATIONS

Disclosed Anonymously, "Method for Memory Subsystem Power Management in Servers", IP.com 000228823, Jul. 9, 2013, 5 pages.
Disclosed Anonymously, "System and Method for Memory Performance and Power Management in Cloud Infrastructure", IP.com No. 000239585; Nov. 17, 2014; 4 pages.

* cited by examiner

MEMORY SYSTEM POWER MANAGEMENT

BACKGROUND

The present invention relates to computer memory systems, and more specifically, to memory system power management.

Error-correcting code (ECC) memory is a type of computer data storage that can detect and correct the most common kinds of internal data corruption. Typically, ECC memory maintains a memory system that is immune to single-bit-errors. Data that is read from each memory location (e.g., a word) is always the same as the data that had been written to the location, even if one or more bits actually stored have been flipped to the wrong state. Dynamic random access memory (DRAM) devices often include extra memory bits and logic to exploit these extra memory bits to correct single bit errors in a memory bit word.

In contemporary memory systems, a memory controller scans systematically through locations in a DRAM to perform a scrub operation on each memory location in the DRAM. Memory scrub operations include reading from a memory location in a memory device, correcting single bit errors (if any) in the read data with an ECC, and writing the corrected data back to the same memory location. During the scrub process, an ECC decoder that is internal to the DRAM is used to detect and correct bit errors. By scrubbing each memory location on a frequent enough basis, the probability of encountering uncorrectable multiple bit errors is reduced. Though scrubbing provides benefits in terms of increased reliability, availability, and serviceability (RAS), it also requires additional logic in a memory controller to manage the read operation by inserting cycles in the scheduler queue, and it consumes additional power.

The trend of increasing memory system capacity has led to an increase in the amount of unused memory and thus, an increase in the power penalties experienced by memory systems when they scrub unused memory. One approach to decreasing the power penalties is to scrub unused memory right before allocation. This approach can result in an impact to performance as memory allocations will experiences relatively significant delays due to the allocation having to include a scrub of the memory. Another approach is to scrub unused memory at a slower rate, which may have the drawback of a decreased ability to detect a soft error rate, and thus RAS is traded for power savings.

SUMMARY

Embodiments include a method, system, and computer program product for power management of a memory in a computer system. A method includes receiving a memory allocation request for a logical partition. Partition mirroring is enabled for the logical partition. Unscrubbed memory is allocated to both a first and a second copy of the logical partition, with the second copy of the logical partition mirroring the first copy of the logical partition. Scrubbing of the first and second copy of the logical partitions is initiated. Subsequent to completing the scrubbing, one of the first and second copy of the logical partition is selected and partition mirroring is disabled for the logical partition. The first copy of the logical partition is deallocated based on selecting the second copy of the logical partition. The second copy of the logical partition is deallocated based on selecting the first copy of the logical partition. The copy that is selected will continue to be scrubbed on a periodic based.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
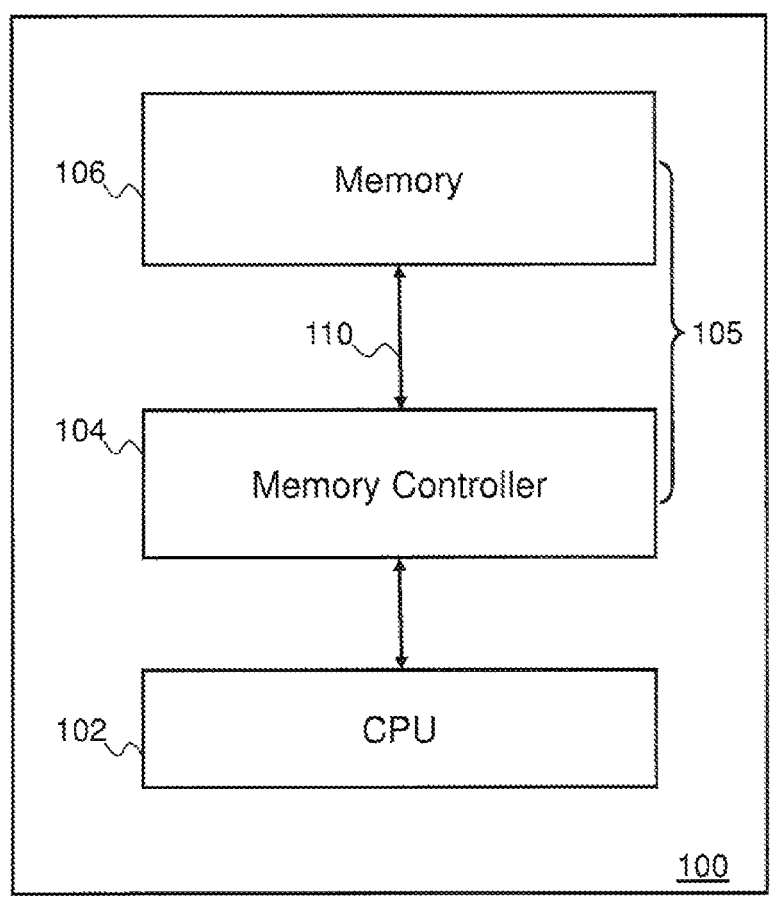
FIG. 1 is a block diagram of an exemplary system that supports memory system power management according to one or more embodiments of the invention.

Embodiments described herein are directed to conserving power in a memory system by scrubbing only memory that is currently being used, and not scrubbing memory that is currently unused. To mitigate the risk of encountering undetected uncorrectable errors in unscrubbed memory, embodiments utilize memory mirroring to provide backup memory until at least one copy is determined to be free of uncorrectable errors. Embodiments utilize the partition memory features of a hypervisor to enable mirroring for the memory allocation process, with unscrubbed memory being allocated to both the mirrored and mirroring copies. Both copies can be scrubbed at a predetermined rate and if an error is identified in one copy the error can be mitigated, by recovering data from the other copy. Embodiments continue to scrub both copies until at least one copy is proven to be good as determined, for example, by detecting less than a threshold number of errors during the scrub process. Once a good copy is identified, the mirroring is turned off and the other copy is deallocated and moved to an unused pool of memory. The scrub process is no longer performed once the other copy is moved to the unused pool of memory. As described herein, embodiments can mitigate the risk of not scrubbing before allocating unused memory and at the same time save the "time" overhead of scrubbing before allocation, by uniquely leveraging partition mirroring.

In virtualized computer systems, a hypervisor manages the memory allocation and deallocation (or release) processes of logical partitions. In contemporary virtualized computer systems both allocated and unallocated memory portions are scrubbed to ensure that unused memory is kept ready without any errors. In these computer systems, RAS is valued over power savings as unused memory that is bad (e.g., has more than a threshold number of errors detected during scrubbing) can be removed from the free memory pool. Since the unallocated memory portion does not contain data that is being used by a logical partition, the scrubbing of unallocated memory portion may not be useful and it uses memory system power. The amount of memory system power wasted, or the power penalty, caused by scrubbing unallocated memory locations increases proportionally to the size of the unused memory area (e.g., less memory usage by applications has more penalty and vice versa).

Embodiments described herein can be utilized to optimize the scrub operation in virtualized systems in order to conserve memory system power without compromising on RAS capabilities.

In contemporary memory systems, a memory controller typically drives a data scrub operation by specifying a word location to be scrubbed. The memory controller passes the address of the word location to be scrubbed to the memory by registering the scrub command.

As used herein, the term DRAM is used to refer to one particular type of memory that may be utilized by embodiments. Other types of memory devices such as, but not limited to: static random access memory (SRAM) and embedded DRAM (EDRAM) may also be utilized by embodiments.

FIG. 1 illustrates a block diagram of a system 100, which is a computer system that supports memory system power management in accordance with one or more embodiments. The system 100 depicted in FIG. 1 includes a computer processor 102, memory 106 including multiple memory devices (e.g., DRAMs), and a memory controller 104 for reading and storing data in the memory 106 via an interface 110. Collectively, the memory controller 104 and the memory 106 are referred to as a memory system 105. The computer processor 102 can be a single core or multi-core processor. In one or more embodiments the memory controller 104 is coupled to the computer processor 102 and receives read or write requests from the computer processor 102.

The system 100 is one example of a configuration that may be utilized to perform the processing described herein. Although the system 100 has been depicted with only a memory 106, memory controller 104, and computer processor 102, it will be understood that other embodiments would also operate in other systems including additional elements, e.g., multiple computers processors 102 and multiple levels of memory 106. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
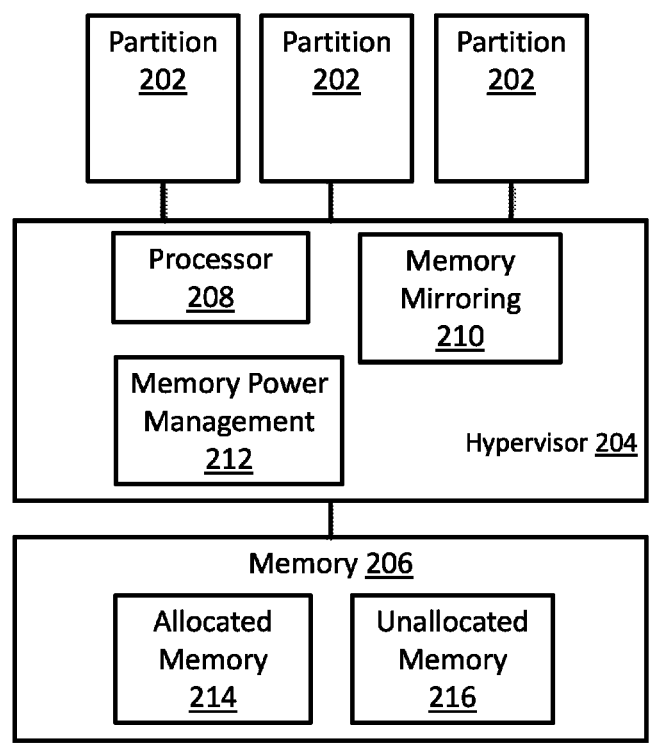
FIG. 2 is a block diagram of components of an exemplary system for memory system power management according to one or more embodiments of the invention.

Turning now to FIG. 2, a block diagram of components of an exemplary system for memory system power management is generally shown according to one or more embodiments. The system shown in FIG. 2 can be characterized as a virtual machine design, or virtualized system, that includes partitions 202, a hypervisor 204, and memory 206. The system shown in FIG. 2 includes a plurality of logical partitions 202 that share common processing resources among multiple processes. The system shown in FIG. 2 may include a single computing machine having one or more processors 208. The logical partitions 202 can logically comprise a portion of a system's physical processor(s) 208 and memory 206. Each logical partition 202 can operate as if it is a separate computer and can host an operating system that includes virtual processors.

The hypervisor 204 shown in FIG. 2 can assign physical resources to each logical partition 202. The hypervisor 204 can manage the system's processor, memory (or storage), and other resources to allocate resources to operating systems executing in the logical partitions 202. As shown in FIG. 2 the hypervisor 204 can access memory mirroring logic 210 that is configured to enable and disable memory mirroring. In addition, the hypervisor 204 can access memory power management logic 212 that is configured to optimize the scrub operation in virtualized systems in order to conserve memory system power. In an embodiment, the hypervisor 204 is implemented by the POWER Hypervisor™ from IBM. The scrub logic cycles through each of the physical memory locations in the memory 206 used by a logical partition 202 to write corrected data values to physical memory 206. In embodiment, the scrub logic is applied only to allocated memory 214 (memory that is currently being used by a partition 202 or the hypervisor 204) in the physical memory 206. In this manner, power is saved because only memory that is currently in use is being scrubbed, the rest of the memory 206 that is currently unused, the unallocated memory 214 remains unscrubbed (the scrub process is not currently being applied). In an embodiment, the scrub process also includes keeping track of a number of bit errors detected during the scrub process.

Figure 3:
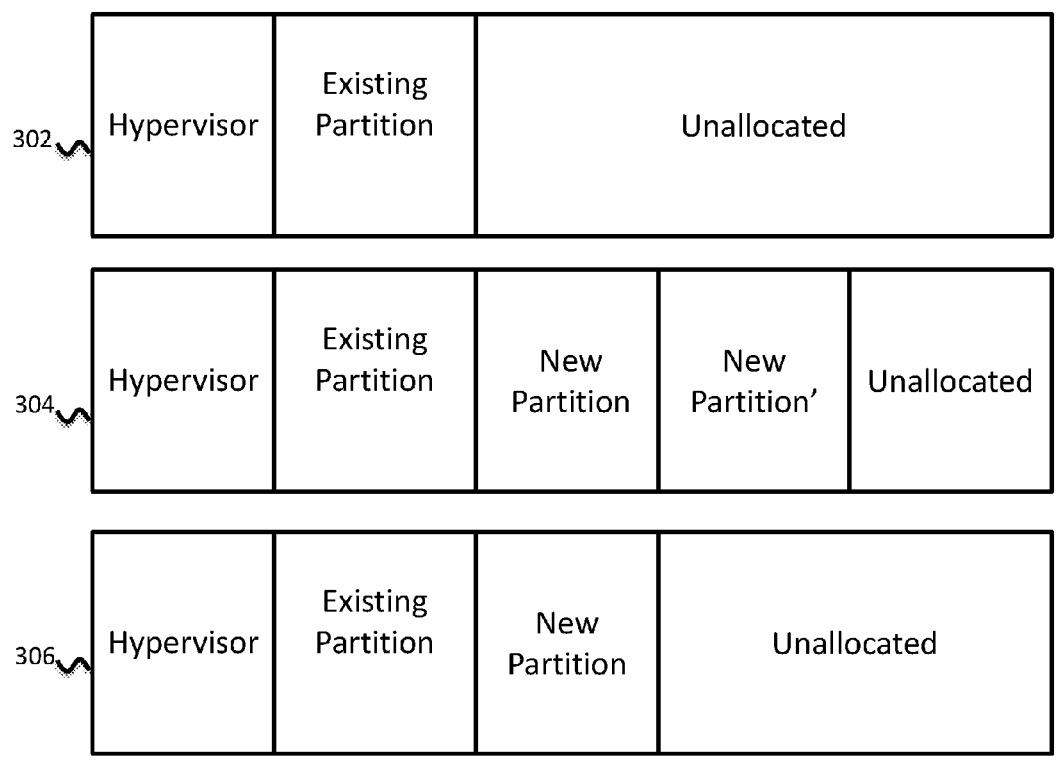
FIG. 3 is a block diagram of allocated and unallocated memory according to one or more embodiments of the invention.

Turning now to FIG. 3, a block diagram of contents of a memory, such as memory 206 in FIG. 2, is generally shown according to one or more embodiments. Block 302 shows an example of contents of a memory prior to memory being allocated to a new partition. Block 302 of FIG. 3 includes a portion of the memory being used by a hypervisor and another portion being used by an existing partition. In an embodiment, both of these portions of the memory are physically located in allocated memory, such as allocated memory 214 in FIG. 2, which is being scrubbed. The portion of the memory labeled "unallocated" in block 302 is not currently being used and currently not being scrubbed (i.e., it is "unscrubbed" memory). In an embodiment, the unallocated portion of the memory is physically located in unallocated memory, such as unallocated memory 216 in FIG. 2, which is unscrubbed memory.

Block 304 shows an example of contents of a memory after memory has been allocated to a new partition and to a mirrored copy of the new partition. Similar to block 302, block 304 of FIG. 3 includes a portion of the memory being used by the hypervisor and another portion being used by the existing partition. In addition, block 304 includes a portion of the memory being used by a new partition and a mirrored copy of the new partition labeled "new partition" and "new partition." In an embodiment, all 4 of these portions of the memory are physically located in allocated memory which is currently being scrubbed. The portion of the memory labeled "unallocated" in block 304 is not currently being used and currently not being scrubbed (i.e., it is "unscrubbed" memory).

Block 306 of FIG. 3 shows an example of contents of a memory after the scrubbing process has been completed, and one of the mirrored and mirroring copies of the new partition has been selected and the other deallocated. Block 306 includes a portion of the memory being used by the hypervisor and another portion being used by the existing partition and the new partition. In an embodiment, all 3 of these portions of the memory are physically located in allocated memory which is currently being scrubbed. The rest of the memory labeled "unallocated" in block 306 is not currently being used and currently not being scrubbed (i.e., it is "unscrubbed" memory).

Figure 4:
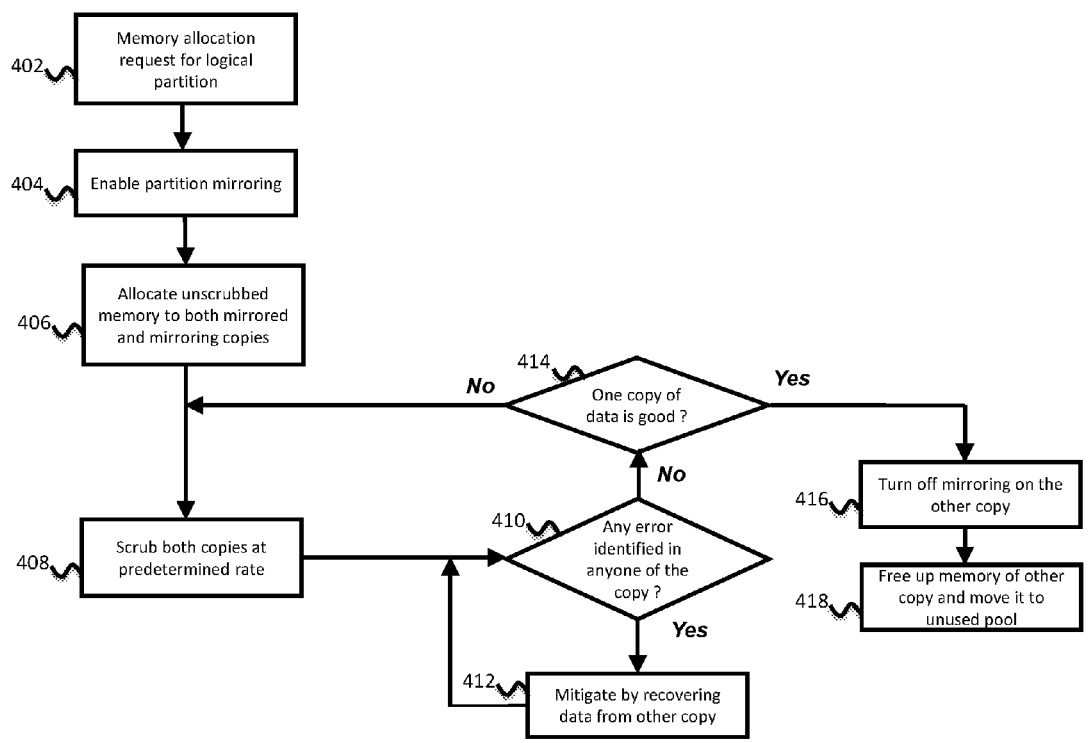
FIG. 4 is a process flow of memory system power management according to one or more embodiments of the invention.

Turning now to FIG. 4, a process flow of memory system power management is generally shown according to one or more embodiments. The processing shown in FIG. 4 can be performed by a processor such as CPU 102, processor 208 and/or processor 502. At block 402, a memory allocation request for a logical partition is received, for example, by a hypervisor. Processing continues at block 404 where partition mirroring is enabled for the requested logical partition. At block 406, unscrubbed memory is allocated to both a first (or mirrored) and a second (or mirroring) copy of the logical partition, where the second copy of the logical partition mirrors the first copy of the logical partition.

In an embodiment, a memory controller, such as memory controller 104, is designed to be able to send a given write to two locations, for example two different physical dual in-line memory modules (DIMMs). The memory controller can then read from either copy, and fetch from the second copy if the first copy is bad. The memory controller can provide an address map to the hypervisor, such as hypervisor 204, where the physical addresses of the two DIMMs, for example, are mapped as two different system address regions. The first system address region can be non-mirrored and can have a 1-to-1 relationship between physical and system addresses. The second system address can be mirrored and can have a 2-to-1 relationship between physical and system addresses. The mirrored and non-mirrored regions can be mapped to different system address ranges. Since the hypervisor has access to the full system address range, it can decide whether to allocate a given partition in the mirrored range or non-mirrored range. To disable mirroring for a mirrored partition, the hypervisor redefines which system address range the partition occupies.

At block 408, scrubbing is initiated on both the first and second copies of the logical partition. In an embodiment, the scrubbing is performed for a predetermined time period that is selected to ensure that all of the physical memory locations are scrubbed at least once.

Processing continues at block 410 where it is determined whether an error (e.g., an uncorrectable error) is identified in one of the copies of the logical partition. If an error is identified, then it can be mitigated at block 412 by recovering data from the other copy and processing continues at block 410. In an embodiment, every read done by the partition goes through an ECC check in the memory controller. If the memory controller detects an uncorrectable error on a given read, it re-does that read from the mirrored copy.

If it is determined at block 410 that no error is detected, then processing continues at block 414 where it is determined whether one of the copies of the logical partition is "good." In an embodiment, a copy of the logical partition is determined to be a good copy when no uncorrectable errors and less than a threshold number of correctable errors are detected in the physical memory of the logical partition during the scrub process. In some cases, both copies of the logical partition may be good copies. A good copy is selected for the logical partition and at block 416 the mirroring is turned off, or disabled, for the logical partition.

At block 418, the memory of the other non-selected copy is freed up (deallocated) and moved to the unallocated pool. As described previously, in accordance with embodiments scrubbing is not performed on the unallocated memory, and thus, the unallocated memory is unscrubbed memory.

Figure 5:
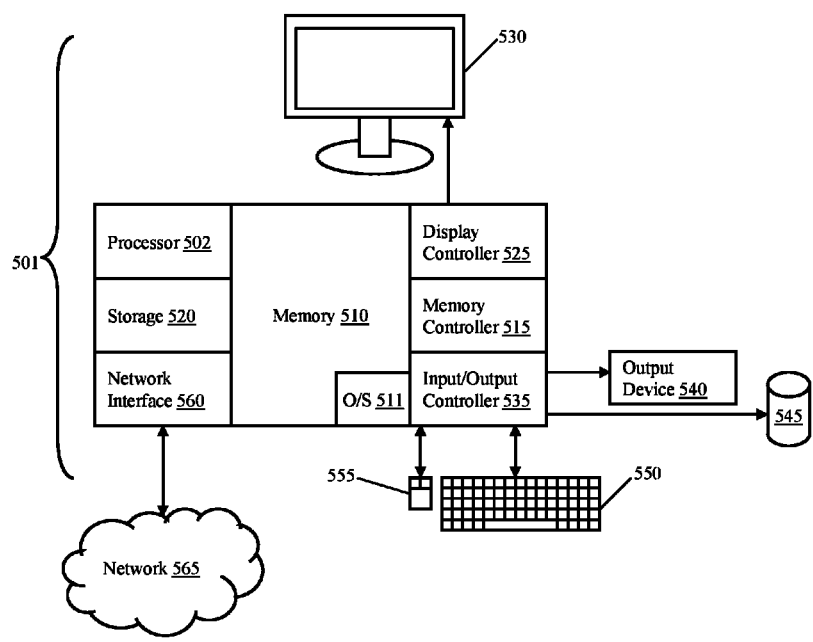
FIG. 5 is a block diagram of a processor for memory system power management according to one or more embodiments of the invention.

Turning now to FIG. 5 is a block diagram of a processor for memory system power management is generally shown according to one or more embodiments. The methods described herein can be implemented in hardware, software (e.g., firmware), or a combination thereof. In an exemplary embodiment, the methods described herein are implemented in hardware as part of the microprocessor of a computer, such as a personal computer, workstation, minicomputer, or mainframe computer. The system therefore includes computer 501 as illustrated in FIG. 5.

In an exemplary embodiment, the computer 501 includes processor 502 of FIG. 1 that is operable to perform memory system power management. The computer 501 further includes memory 510 (e.g., main memory) coupled to a memory controller 515, and one or more input and/or output (I/O) devices 540, 545 (or peripherals) that are communicatively coupled via a local input/output controller 535. The input/output controller 535 can be, for example but not limited to, one or more buses or other wired or wireless connections, as is known in the art. The input/output controller 535 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 502 is a hardware device for executing software, particularly that stored in storage 520, such as cache storage, or memory 510. The processor 502 can be any custom made or commercially available processor, a central processing unit (CPU), an auxiliary processor among several processors associated with the computer 501, a semiconductor based microprocessor (in the form of a microchip or chip set), a macroprocessor, or generally any device for executing instructions.

The memory 510 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 510 may incorporate electronic, magnetic, optical, and/or other types of storage media. Note that the memory 510 can have a distributed architecture, where various components are situated remote from one another, but can be accessed by the processor 502.

The instructions in memory 510 may include one or more separate programs, each of which comprises an ordered listing of executable instructions for implementing logical functions. In the example of FIG. 5, the instructions in the memory 510 can include a suitable operating system (OS) 511. The operating system 511 essentially controls the execution of other computer programs and provides scheduling, input-output control, file and data management, memory management, and communication control and related services.

In an exemplary embodiment, a conventional keyboard 550 and mouse 555 can be coupled to the input/output controller 535. Other output devices such as the I/O devices 540, 545 may include input devices, for example but not limited to a printer, a scanner, microphone, and the like. Finally, the I/O devices 540, 545 may further include devices that communicate both inputs and outputs, for instance but not limited to, a network interface card (NIC) or modulator/ demodulator (for accessing other files, devices, systems, or a network), a radio frequency (RF) or other transceiver, a telephonic interface, a bridge, a router, and the like. The system can further include a display controller 525 coupled to a display 530. In an exemplary embodiment, the system can further include a network interface 560 for coupling to a network 565. The network 565 can be an IP-based network for communication between the computer 501 and any external server, client and the like via a broadband connection. The network 565 transmits and receives data between the computer 501 and external systems. In an exemplary embodiment, network 565 can be a managed IP network administered by a service provider. The network 565 may be implemented in a wireless fashion, e.g., using wireless protocols and technologies, such as WiFi, WiMax, etc. The network 565 can also be a packet-switched network such as a local area network, wide area network, metropolitan area network, Internet network, or other similar type of network environment. The network 565 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 501 is a PC, workstation, intelligent device or the like, the instructions in the memory 510 may further include a basic input output system (BIOS) (omitted for simplicity). The BIOS is a set of essential software routines that initialize and test hardware at startup, start the OS 511, and support the transfer of data among the hardware devices. The BIOS is stored in ROM so that the BIOS can be executed when the computer 501 is activated. BIOS or other instructions in memory 510 or storage 520 may trigger and manage execution of a stress test mode as part of a built-in self-test process.

When the computer 501 is in operation, the processor 502 is configured to fetch and execute instructions stored within the memory 510, to communicate data to and from the memory 510, and to generally control operations of the computer 501 pursuant to the instructions.

In an exemplary embodiment, where the memory system power management is implemented in hardware, the methods described herein, such as the processing shown in FIG. 4, can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Technical effects and benefits include the ability to optimize the scrub operation in virtualized systems in order to conserve memory system power without compromising on RAS capabilities.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method of power management in a memory of a computer system, the method comprising:
    receiving a memory allocation request for a logical partition;
    enabling partition mirroring for the logical partition;
    allocating unscrubbed memory to both a first and a second copy of the logical partition, the second copy of the logical partition mirroring the first copy of the logical partition;
    initiating scrubbing of the first and second copy of the logical partition;
    subsequent to initiating the scrubbing:
        selecting one of the first and second copy of the logical partition, wherein prior to the selecting, the scrubbing is performed until a number of errors detected in at least one of the first copy of the logical partition and the second copy of the logical partition is less than a threshold number of errors;
        disabling partition mirroring for the logical partition;
        deallocating the first copy of the logical partition based on selecting the second copy of the logical partition; and
        deallocating the second copy of the logical partition based on selecting the first copy of the logical partition; and
    periodically scrubbing the selected one of the first and second copy of the logical partition.

2. The method of claim 1, wherein the selecting is based on a number of errors detected during the scrubbing.

3. The method of claim 2, wherein the first copy of the logical partition is selected based on the first copy of the logical partition having a same or fewer number of errors detected during the scrubbing than the second copy of the logical partition, and the second copy of the logical partition is selected based on the second copy of the logical partition having a fewer number of errors detected during the scrubbing than the first copy of the logical partition.

4. The method of claim 1, wherein prior to the selecting, the scrubbing is performed for a predetermined time period.

5. The method of claim 1, wherein errors detected in the first copy of the logical partition during the scrubbing are corrected based on contents of the second copy of the logical partition.

6. The method of claim 1, wherein the deallocating of the first copy of the logical partition includes halting scrubbing of the first copy of the logical partition.

7. A computer system comprising:
a processor; and
program code configured to be executed by the processor to:
receive a memory allocation request for a logical partition;
enable partition mirroring for the logical partition;
allocate unscrubbed memory to both a first and a second copy of the logical partition, the second copy of the logical partition mirroring the first copy of the logical partition;
initiate scrubbing of the first and second copy of the logical partition;
subsequent to initiating the scrubbing:
selecting one of the first and second copy of the logical partition, wherein prior to the selecting, the scrubbing is performed until a number of errors detected in at least one of the first copy of the logical partition and the second copy of the logical partition is less than a threshold number of errors;
disabling partition mirroring for the logical partition;
deallocating the first copy of the logical partition based on selecting the second copy of the logical partition; and
deallocating the second copy of the logical partition based on selecting the first copy of the logical partition; and
periodically scrub the selected one of the first and second copy of the logical partition.

8. The computer system of claim 7, wherein the selecting is based on a number of errors detected during the scrubbing in the first and second copies of the logical partition.

9. The computer system of claim 8, wherein the first copy of the logical partition is selected based on the first copy of the logical partition having a same or fewer number of errors detected during the scrubbing than the second copy of the logical partition, and the second copy of the logical partition is selected based on the second copy of the logical partition having a fewer number of errors detected during the scrubbing than the first copy of the logical partition.

10. The computer system of claim 7, wherein prior to the selecting, the scrubbing is performed for a predetermined time period.

11. The computer system of claim 7, wherein errors detected in the first copy of the logical partition during the scrubbing are corrected based on contents of the second copy of the logical partition.

12. The computer system of claim 7, wherein the deallocating of the first copy of the logical partition includes halting scrubbing of the first copy of the logical partition.

13. A computer program product for power management in a memory of a computer system, the computer program product comprising a non-transitory computer readable storage medium having program instructions embodied therewith, the program instructions executable by processing circuitry to cause the processing circuitry to:
receive a memory allocation request for a logical partition;
enable partition mirroring for the logical partition;
allocate unscrubbed memory to both a first and a second copy of the logical partition, the second copy of the logical partition mirroring the first copy of the logical partition;
initiate scrubbing of the first and second copy of the logical partition;
subsequent to initiating the scrubbing:
selecting one of the first and second copy of the logical partition, wherein prior to the selecting, the scrubbing is performed until a number of errors detected in at least one of the first copy of the logical partition and the second copy of the logical partition is less than a threshold number of errors;
disabling partition mirroring for the logical partition;
deallocating the first copy of the logical partition based on selecting the second copy of the logical partition; and
deallocating the second copy of the logical partition based on selecting the first copy of the logical partition; and
periodically scrubbing the selected one of the first and second copy of the logical partition.

14. The computer program product of claim 13, wherein the selecting is based on a number of errors detected during the scrubbing in the first and second copies of the logical partition.

15. The computer program product of claim 13, wherein the first copy of the logical partition is selected based on the first copy of the logical partition having a same or fewer number of errors detected during the scrubbing than the second copy of the logical partition, and the second copy of the logical partition is selected based on the second copy of the logical partition having a fewer number of errors detected during the scrubbing than the first copy of the logical partition.

16. The computer program product of claim 13, wherein prior to the selecting, the scrubbing is performed for a predetermined time period.

17. The computer program product of claim 13, wherein errors detected in the first copy of the logical partition during the scrubbing are corrected based on contents of the second copy of the logical partition.

* * * * *